United States Patent
Woehl et al.

(10) Patent No.: US 9,768,327 B2
(45) Date of Patent: Sep. 19, 2017

(54) ETCHING TECHNIQUES FOR SEMICONDUCTOR DEVICES

(71) Applicants: Robert Woehl, San Jose, CA (US); David Aaron Randolph Barkhouse, Menlo Park, CA (US); Paul Loscutoff, Castro Valley, CA (US)

(72) Inventors: Robert Woehl, San Jose, CA (US); David Aaron Randolph Barkhouse, Menlo Park, CA (US); Paul Loscutoff, Castro Valley, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 0 days.

(21) Appl. No.: 14/751,095

(22) Filed: Jun. 25, 2015

(65) Prior Publication Data
US 2016/0380122 A1 Dec. 29, 2016

(51) Int. Cl.
H01L 31/02 (2006.01)
H01L 31/06 (2012.01)
H01L 21/32 (2006.01)
H01L 31/18 (2006.01)
H01L 21/3213 (2006.01)

(52) U.S. Cl.
CPC ........ *H01L 31/02013* (2013.01); *H01L 31/18* (2013.01); *H01L 21/32134* (2013.01); *Y02E 10/50* (2013.01)

(58) Field of Classification Search
CPC ......... H01L 31/02013; H01L 21/32134; H01L 31/18
USPC .................................................... 438/584, 57
See application file for complete search history.

(56) References Cited

U.S. PATENT DOCUMENTS

| 4,888,449 A * | 12/1989 | Crane ................ H01L 23/057 |
| | | 174/540 |
| 6,468,439 B1 * | 10/2002 | Whitehurst ............... C23F 1/02 |
| | | 216/100 |
| 7,897,867 B1 | 3/2011 | Mulligan et al. |
| 2008/0210301 A1 | 9/2008 | Mulligan et al. |
| 2008/0216887 A1 | 9/2008 | Hacke et al. |
| 2009/0139868 A1 | 6/2009 | Shrader et al. |
| 2011/0146747 A1 | 6/2011 | Hieslmair |

(Continued)

FOREIGN PATENT DOCUMENTS

KR 20110018651 2/2011

OTHER PUBLICATIONS

International Search Report and Written Opinion for PCT Patent Application No. PCT/US16/38580 mailed Sep. 29, 2016, 13 pgs.

*Primary Examiner* — Moazzam Hossain
*Assistant Examiner* — Omar Mojaddedi
(74) *Attorney, Agent, or Firm* — Schwabe, Williamson & Wyatt P.C.

(57) ABSTRACT

Fabricating a semiconductor device can include forming a metal seed region over a substrate. The method can include forming a mask over a first portion of the metal seed region. The method can also include forming a metal region over the metal seed region and removing the mask. The method can include forming metal contact fingers on the semiconductor device, where the forming includes etching the first portion of the metal seed region with an etchant comprising an acid, an oxidizer and chloride ions.

20 Claims, 8 Drawing Sheets

(56) References Cited

U.S. PATENT DOCUMENTS

| | | | |
|---|---|---|---|
| 2011/0312119 A1* | 12/2011 | Rose | H01L 31/18 438/57 |
| 2012/0204938 A1 | 8/2012 | Hacke et al. | |
| 2014/0011352 A1* | 1/2014 | Choung | C23F 1/18 438/652 |
| 2014/0357055 A1* | 12/2014 | Gissibl | H01L 21/30604 438/462 |
| 2015/0041192 A1* | 2/2015 | Han | H05K 3/108 174/257 |

* cited by examiner

ETCHING TECHNIQUES FOR SEMICONDUCTOR DEVICES

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" metal region does not necessarily imply that this metal region is the first metal region in a sequence; instead the term "first" is used to differentiate this metal region from another metal region (e.g., a "second" metal region).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification includes a description of an example method for fabricating a semiconductor device, followed by example semiconductor devices formed from the described methods. For ease of understanding, many of the examples and much of the description focuses on solar cells, but note that the described techniques can also apply to other semiconductor devices. In various embodiments, the solar cell can be a single-crystalline solar cell or a multi-crystalline solar cell and can be a back-contact solar cell or a front-contact solar cell. Various examples are provided throughout.

Figure 1:
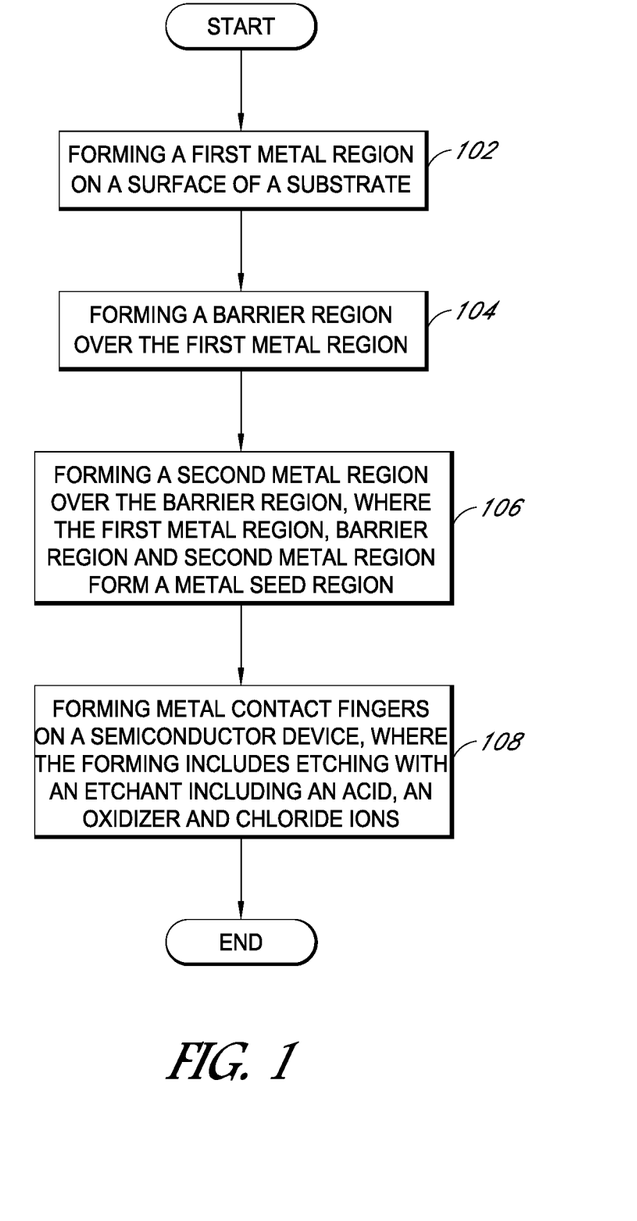
FIG. 1 illustrates a flow chart representation of an example method for fabricating a semiconductor device, according to some embodiments.

Turning now to FIG. 1, a method for fabricating a semiconductor device is shown, according to some embodiments. In various embodiments, the method of FIG. 1 can include additional (or fewer) blocks than illustrated. For example, in some embodiments, a barrier region need not be formed at block 104 and a second metal region can instead be formed directly over the first metal region.

Figure 2:
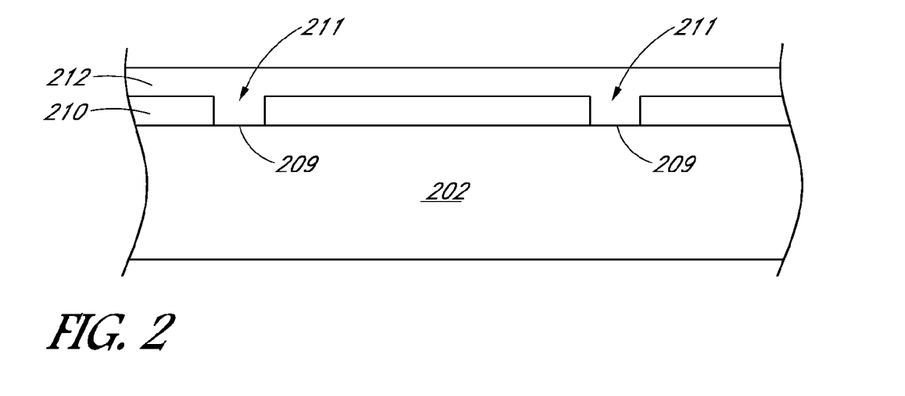
FIGS. 2-4 illustrate cross-sectional views of example semiconductor devices during the formation of a metal seed region, according to some embodiments.

Referring to FIG. 2, and corresponding operation 102 of the flowchart of FIG. 1, a first metal region 212 can be formed over a surface 209 of a substrate 202, according to some embodiments. In an embodiment, prior to forming the first metal region 212, a dielectric region 210 can be formed between the first metal region 212 and the surface 209 of the substrate 202, as shown. In an embodiment, the dielectric region 210 can include silicon oxide and/or other oxides. In an embodiment, a contact opening 211 can be formed in the dielectric region 210 as shown and, as a result, the first metal region 212 can be formed on the surface 209 of the substrate 202 within the contact opening 211. In an example, the contact opening 211 can be formed by laser ablation and/or by a mask and etch process, among others. In an embodiment, the substrate 202 can be a silicon substrate, such as an n-doped monocrystalline substrate.

In an embodiment, the first metal region 212 can include aluminum (e.g., an aluminum region), aluminum/Si, and/or alloys thereof, a metal silicide, among other examples. In an embodiment, the first metal region 212 can be formed by blanket deposition, by printing techniques (e.g., screen printing, ink-jet printing and/or spin coating), among other examples. Note that although the first metal region 212 is described as a metal region, in some embodiments, region 212 can be a non-metal conductive region, such as a conductive carbon.

Figure 3:
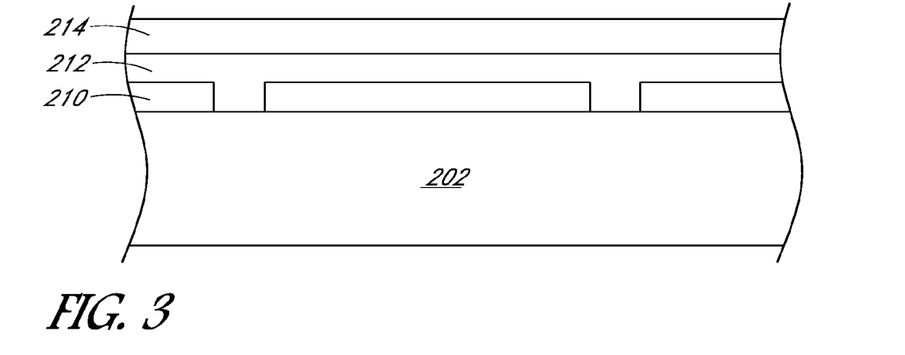

FIG. 3, and corresponding operation 104 of the flowchart of FIG. 1, illustrates forming a barrier region 214 over the first metal region 212, according to some embodiments. In one embodiment, the barrier region 212 can include one or more metal regions. In an embodiment, the barrier region 214 can include one or more of nickel, a nickel vanadium alloy, molybdenum, molybdenum titanium alloy, and/or alloys thereof. In an embodiment, the barrier region 214 can be formed by blanket deposition. In an embodiment, printing techniques, including screen printing, ink jet printing, and/or spin coating, among other examples, can be used to deposit the barrier region 214 over the first metal region 212. In an embodiment, the barrier region 214 can be a metal nitride (e.g., titanium nitride, tantalum nitride). In some embodiments, the barrier region 214 need not be formed at block 104 of FIG. 1.

Figure 4:
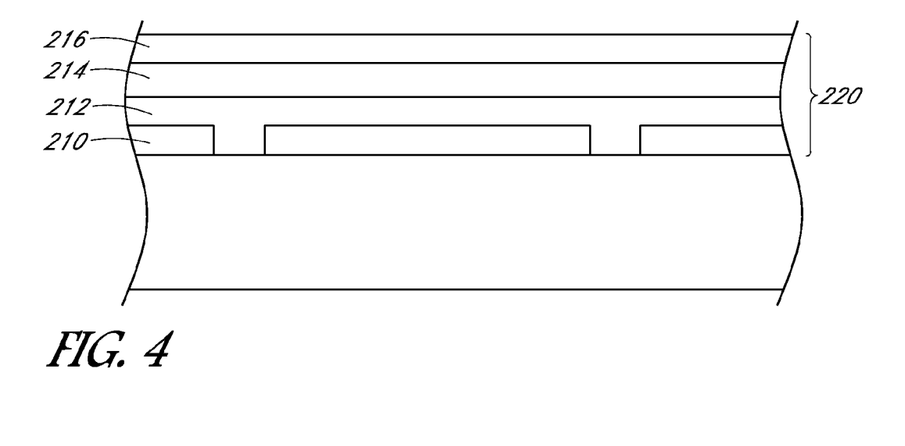

Referring to FIG. 4, and corresponding operation 106 of the flowchart of FIG. 1, a second metal region 216 can be formed over the barrier region 214, according to some embodiments. In an embodiment, the second metal region 216 can include copper or nickel (e.g., a copper or nickel region), and/or alloys thereof. In an embodiment, the second metal region 216 can be formed by blanket deposition, by printing techniques (e.g., screen printing, ink jetprinting and/or spin coating), among other examples. In some embodiments, the barrier region 214 need not be formed and the second metal region 216 can instead be formed directly on the first metal region 212.

In an embodiment, the combination of one or more of the first metal region 212, barrier region 214 and second metal region 216 can be referred to as a metal seed region 220.

Referring to operation 108 of the flowchart of FIG. 1, metal contact fingers can be formed on the semiconductor device. In an embodiment, the forming can include etching with an etchant including an acid, an oxidizer and chloride ions. In one embodiment, FIGS. 5-8 illustrate a method of forming metal contact fingers on a semiconductor. FIG. 9 illustrates an example solar cell fabricated from the method of FIGS. 1-8. In an embodiment, FIGS. 10-13 illustrate another method of forming metal contact fingers on the semiconductor device. FIG. 14 illustrates an example solar cell fabricated from the method of FIGS. 1-4 and 10-13. Note that although metal contact fingers are described, in some embodiments, the metal contact fingers can be referred to as conductive contact regions.

Figure 5:
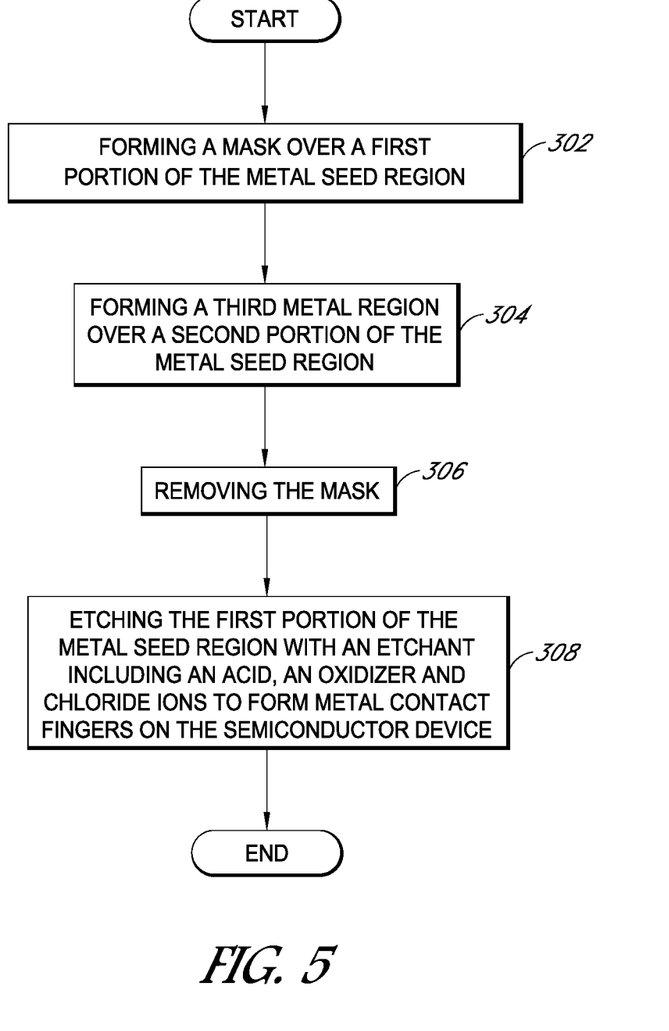
FIG. 5 illustrates a flow chart representation of an example method for forming metal contact fingers, according to some embodiments.

Turning now to FIG. 5, a method for forming metal contact fingers on a semiconductor device is shown, according to some embodiments. In various embodiments, the method of FIG. 5 can include additional (or fewer) blocks than illustrated. For example, in some embodiments, a protective region can be formed on the third metal region after block 304, where the protective region can inhibit etching, at block 309, of the third metal region.

With reference to FIGS. 6-9, an embodiment for forming metal contact fingers on a semiconductor device is shown. As shown, the semiconductor device of FIGS. 6-9 has similar reference numbers to elements of FIGS. 2-4, where like reference numbers refer to similar elements throughout the figures.

Figure 6:
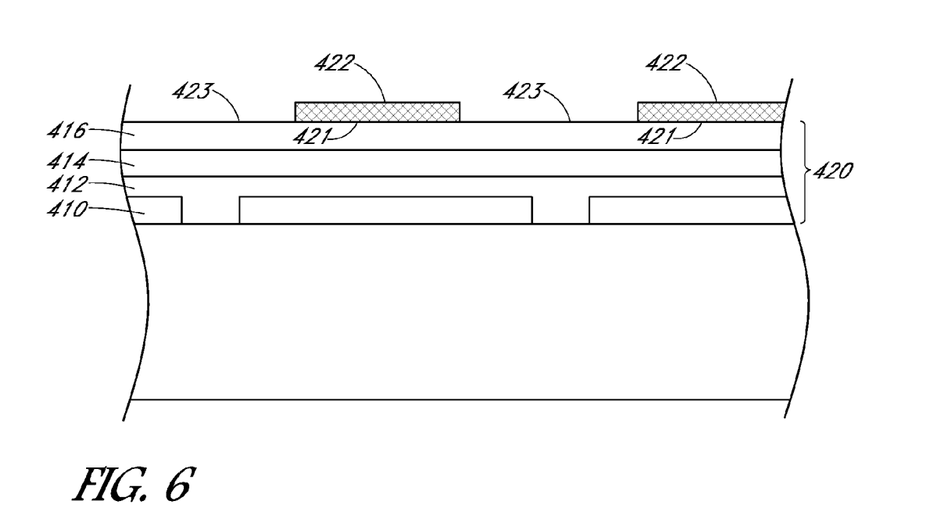
FIGS. 6-8 illustrate cross-sectional views of example semiconductor devices during a metallization process to form metal contact fingers on the semiconductor, according to some embodiments.

FIG. 6, and corresponding operation 302 of the flowchart of FIG. 5, illustrates forming a mask 422 over a first portion 421 of a metal seed region 420, according to some embodiments. In an embodiment, the mask 422 can be an ink, e.g., an etch resist ink. In an embodiment, printing techniques, including screen printing, ink-jet printing and/or spin coating, among other examples, can be used to deposit the mask 422 over the first portion 421 of the metal seed region 420. In an embodiment, the metal seed region 420 can include first metal region 412, a barrier region 414, and a second metal region 416. In an embodiment, a second portion 423 of the metal seed region 420 can be exposed, e.g., not have any ink over that portion.

Figure 7:
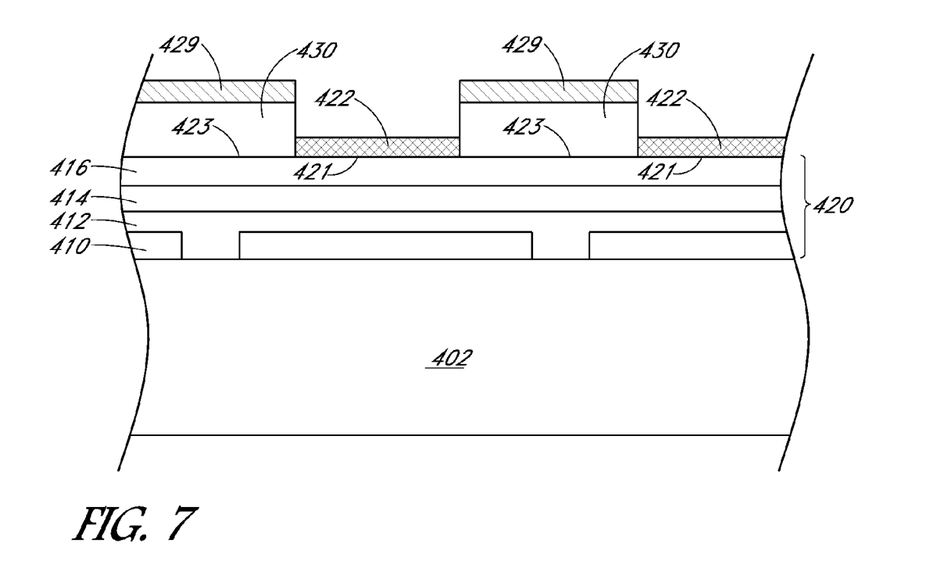

Referring to FIG. 7, and corresponding operation 304 of the flowchart of FIG. 5, a third metal region 430 can be formed over the first second portion 423 of FIG. 6, according to some embodiments. In an embodiment, the third metal region 430 can include copper, nickel (e.g., a copper or nickel region), and/or alloys thereof, among other examples. In an embodiment, the third metal region 430 can be formed with a plating process. In an embodiment, the third metal region 430 can be plated directly to the second portion 423 of FIG. 6.

In an embodiment, the mask 422 can inhibit plating of the third metal 430 to the first portion 421 of the metal seed region 420, as shown in FIG. 7.

In an embodiment, a protective region 429 can be formed over the third metal region 430. In an embodiment, a plating process can be used to form the protective region 429 over the third metal region 430. In an embodiment, the protective region 429 can be conductive (e.g., capable of conducting electricity). In an embodiment, the protective region 429 can include tin or silver. In an embodiment, the protective region 429 need not be formed.

Figure 8:
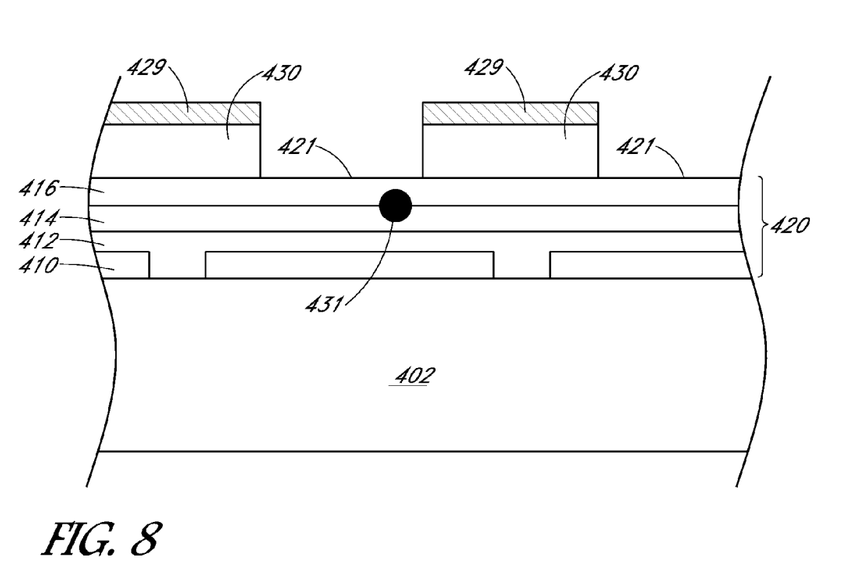
Figure 9:
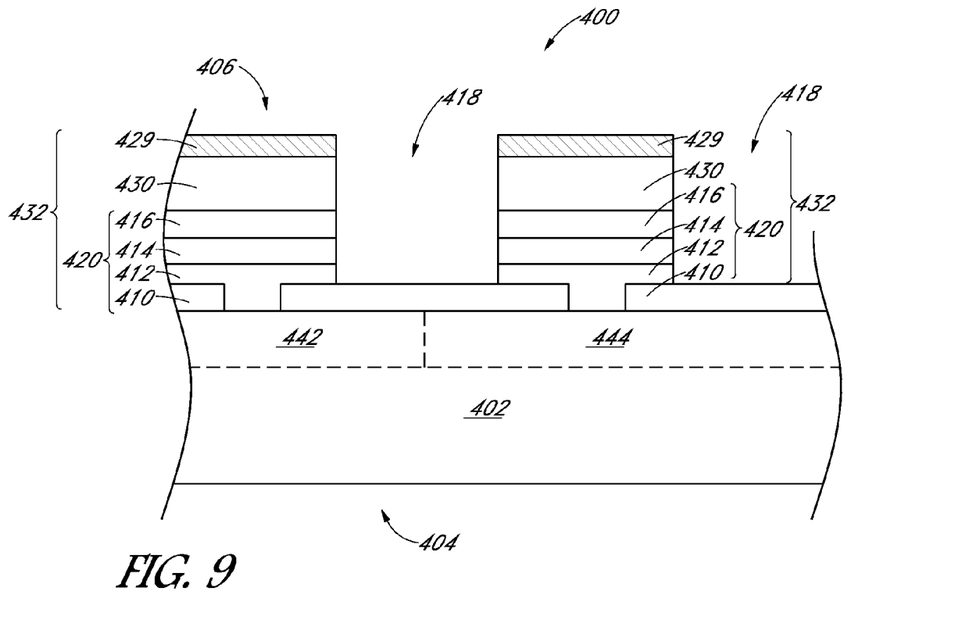
FIG. 9 illustrates an example solar cell, according to some embodiments.

FIG. 8, and corresponding operation 306 of the flowchart of FIG. 5, illustrates removing the mask 422 of FIGS. 6 and 7, according to some embodiments. In an embodiment, an ink strip process can be performed to remove the mask 422 of FIG. 7. In an embodiment, after removing the mask 422, the first portion 421 of the metal seed region 420 can be exposed, e.g., not have any ink over that portion.

Intermetallics 431 are mixtures of at least two metals which can form during the semiconductor fabrication process. In an embodiment, intermetallics 431 can be formed during the formation of the metal seed region 420. In an embodiment, intermetallics 431 can be formed between the barrier region 414 and the second metal region 416 as shown. In some embodiments, intermetallics 431 can be formed on the metal seed region 420.

Intermetallics 431 can be detrimental to a semiconductor device, where intermetallics 431 can be sources of shorts and/or shunts on a semiconductor device. In an example an intermetallic 431 can include aluminum-copper mixture, aluminum-nickel mixture, among others.

Referring to FIG. 9, and corresponding operation 308 of the flowchart of FIG. 5, the first portion 421 of FIG. 8 can be etched with an etchant including an acid, an oxidizer and chloride ions, according to some embodiments. In an embodiment, the etching forms metal contact fingers 432 on the semiconductor device 400. In an embodiment, the metal contact fingers 432 can be interdigitated metal contact fingers.

In an embodiment, the acid can include sulfuric acid, ferric chloride and/or phosphoric acid among others. In an embodiment, the oxidizer can include hydrogen peroxide and/or ferric chloride, among other oxidizers. In an embodiment, an acid or a salt can be used as a source for chloride ions. In an embodiment, ferric chloride, hydrogen chloride, potassium chloride and/or sodium chloride, among others, can be used as a source of chloride ions.

In an embodiment, etching the first portion 421 of FIG. 8 can include etching the first metal region 412, barrier region 414 and second metal region 416 in a single bath (e.g., in a single process), in contrast to other methods which can etch away the first metal region 412, barrier region 414, or second metal region 416 in individual baths and/or process steps. In an embodiment, the etching can include a single etching bath, where other methods can have 2-3 etching baths (e.g., other processes can include separate etching baths for each of the first metal region 412, barrier region 414 and second metal region 416).

In an example of a single bath etchant, a metal seed region 420 having a first metal region 412 including aluminum, a barrier region 414 including molybdenum and second metal region 416 including a copper region can be etched with sulfuric acid, phosphoric acid, hydrogen peroxide and ferric chloride in a single bath.

In an embodiment, the etchants used (e.g., sulfuric acid, phosphoric acid, hydrogen peroxide and ferric chloride, among others) can be less than or equal to 10% of the total weight percent of an etching solution used, where the remaining 90% of the etching solution can be water. In an embodiment, the percent concentration of the oxidizer can be greater than, or at least comparable to, the combined percent concentration of the acid and source of chloride ions. In an embodiment, the percent concentration of the acid can be less than the percent concentration of the oxidizer.

In an embodiment, the first metal region 412, barrier region 414 and second metal region 416 can be etched in a single bath and/or process using an etchant including an acid, an oxidizer, and chloride ions. In an example, using ferric chloride as a chloride ion source in the etchant can substantially increase the etch rate of the barrier region 414 (e.g., molybdenum). In an embodiment, the etch rate can increase by a factor of 10. In an example, provided the same chloride ion concentration, the etch rate can increase from 50-70 micron/minute to 500-700 micron/minute by using ferric chloride.

In an embodiment, the etching can include at least partially etching the protective region 429 over the third metal region 430, where the protective region 429 can inhibit etching, at block 308, of the third metal region 430. In an example, the ratio of the hydrogen peroxide to acid used can be greater than 1 to reduce the etch rate of a protective region 429.

In an embodiment, a separation region 418 can be formed to separate metal contact fingers 432 of different polarity (e.g., a positive and a negative contact finger) from contacting. In some embodiments, the separation region 418 can include a trench region, where the trench region can be partially disposed in the silicon substrate (e.g., substrate 402).

Referring to FIGS. 8 and 9, an etchant including an acid, an oxidizer, and chloride ions can be used to etch away the intermetallics 431 of FIG. 8. In an example, etching with an etchant including an acid, an oxidizer, and sodium chloride and/or ferric chloride can increase the etch rate of an aluminum-copper intermetallic from approximately 0.1 micron/minute to greater than 1 micron/minute at a temperature below a temperature of 50 degrees Celsius. In other methods of etching, intermetallics 431 can remain after the etching process.

FIG. 9 illustrates an example semiconductor device formed from the methods described in FIGS. 1-9, according to some embodiments. As shown, the semiconductor device 400 can be a solar cell. In an embodiment, the semiconductor device 400 can have a front side 404 which faces the sun during normal operation and a back side 406 opposite the front side 404. In an embodiment, the semiconductor device 400 can include a substrate 402.

In an embodiment, the substrate 402 can be a silicon substrate. In some embodiments, the silicon substrate can be cleaned, polished, planarized and/or thinned or otherwise processed prior to the formation of the first metal region 412. In an embodiment, the silicon substrate can be single-crystalline or a multi-crystalline silicon substrate.

The silicon substrate can be an N-type or a P-type silicon substrate, and can include N-type and P-type doped regions 442, 444 as shown in FIG. 9. In an embodiment, the N-type and P-type doped regions 442, 444 can be in the substrate 402. In an embodiment, the N-type and P-type doped regions can be formed over the substrate 402. In an example, the N-type and P-type doped regions 442, 444 can be doped polysilicon regions. In an embodiment, the doped polysilicon regions can be formed over the substrate. In one embodiment, a dielectric region (e.g., a tunnel oxide) can be formed between the doped polysilicon regions and the substrate. In an embodiment, the metal contact fingers 432 allow for pathways for electrical current conduction from the N-type and P-type doped regions 442, 444 to an external circuit.

In an embodiment, metal contact fingers 432 can be formed on the semiconductor device 400. In an embodiment, the metal contact fingers 432 can include a metal seed region 420. In an embodiment, the metal seed region 420 can include a first metal region 412, a barrier region 414 and a second metal region 416. In an embodiment, a dielectric region 410 can be between the first metal region 412 and the substrate 402, as shown. In an embodiment, the dielectric region 410 can include silicon oxide, among other oxides. In an embodiment, the first metal region 412 can include aluminum (e.g., an aluminum region), aluminum/Si, and/or alloys thereof. In an embodiment, the barrier region 414 can include nickel, a nickel vanadium alloy, molybdenum, molybdenum titanium alloy, and/or alloys thereof. In an embodiment, the second metal region 416 can include copper or nickel (e.g., a copper or nickel region), and/or alloys thereof. As described herein, note that, in some embodiments, the metal seed region 420 can include first and second metal regions 412, 416 without a barrier region 414.

In an embodiment, the metal contact fingers 432 can include a third metal region 430 and a protective region 429. In an embodiment, the third metal region 430 can include copper, nickel (e.g., a copper or nickel region), and/or alloys thereof. In an embodiment, the protective region 429 can include tin or silver. In an embodiment, a separation region 418 can be formed to separate metal contact fingers 432 of different polarity (e.g., a positive and a negative contact finger) from contacting. In some embodiments, the separation region 418 can include a trench region, where the trench region can be a partially etched region of the silicon substrate (e.g., substrate 402).

In an embodiment, the metal contact fingers 432 can instead be formed on a front side of a solar cell (e.g., for a front-contact solar cell). In the same embodiment, the separation region 418 between metal contact fingers 432 can be formed to allow for reduced shading, e.g., to maximize light collection, on a front surface of a front-contact solar cell.

Figure 10:
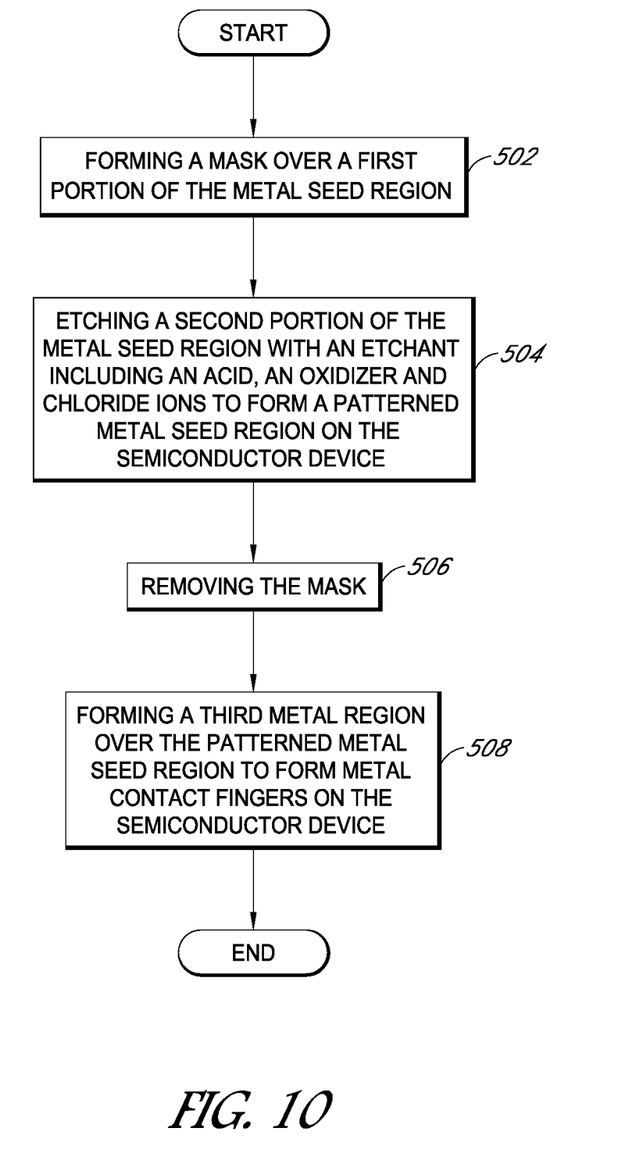
FIG. 10 illustrates a flow chart representation of another example method for forming metal contact fingers, according to some embodiments.

Turning now to FIG. 10, a method for forming metal contact fingers on a semiconductor device is shown, according to some embodiments. In various embodiments, the method of FIG. 10 can include additional (or fewer) blocks than illustrated. For example, in some embodiments, a protective region can be formed on the third metal region after block 508.

With reference to FIGS. 11-14, an embodiment for forming metal contact fingers on a semiconductor device is shown, according to some embodiments. As shown, the semiconductor device of FIGS. 11-14 have similar reference numbers to elements of FIGS. 6-9, wherein like reference numbers refer to similar elements throughout the figures.

Figure 11:
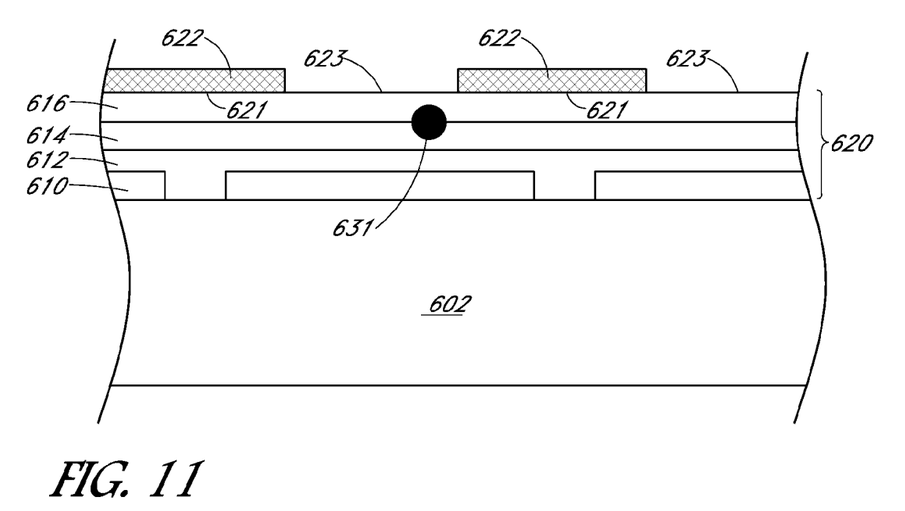
FIGS. 11-13 illustrate cross-sectional views of example semiconductor devices during another metallization process to form metal contact fingers on the semiconductor, according to some embodiments.

FIG. 11, and corresponding operation 502 of the flowchart of FIG. 10, illustrates forming a mask 622 over a first portion 621 of a metal seed region 620, according to some embodiments. In an embodiment, the mask 622 can be an ink, e.g., an etch resist ink. In an embodiment, printing techniques, including screen printing and/or spin coating, among others, can be used to deposit the mask 622 over the first portion 621 of the metal seed region 620. In an embodiment, the metal seed region 620 can include a first metal region 612, a barrier region 614, and a second metal region 616. In an embodiment, a second portion 623 of the metal seed region 620 can be exposed, e.g., not have any ink over that portion.

As discussed in FIG. 8, intermetallics 631 are mixtures of at least two metals which can form during the semiconductor fabrication process. In an embodiment, intermetallics 631 can be formed during the formation of the metal seed region 620. In an embodiment, intermetallics 631 can be formed between the barrier region 614 and the second metal region 616 as shown. In some embodiments, intermetallics 631 can be formed on the metal seed region 620.

Intermetallics 631 can be detrimental to a semiconductor device, where intermetallics 631 can be sources of shorts and/or shunts on a semiconductor device. In an example an intermetallic 631 can include aluminum-copper mixture, aluminum-nickel mixture, among others.

Figure 12:
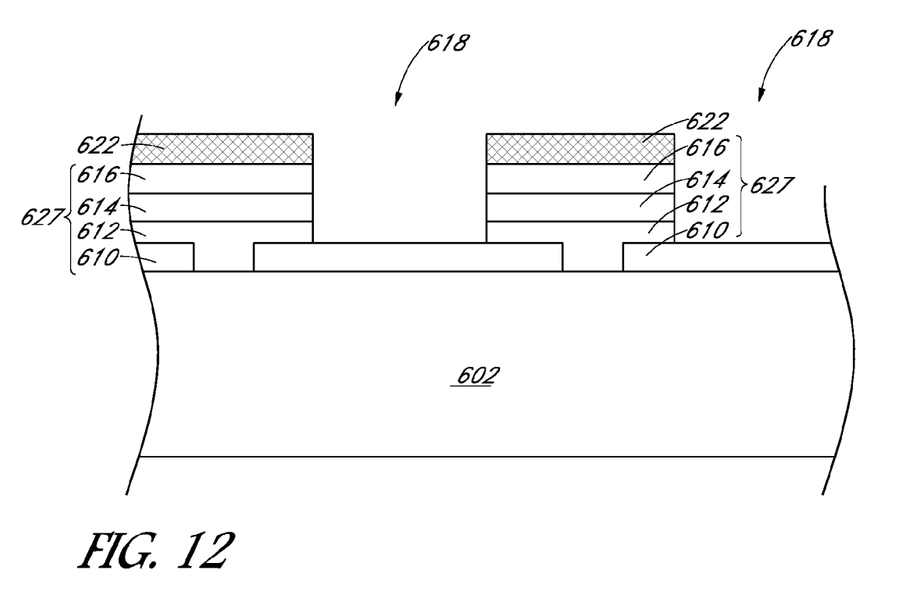

Referring to FIG. 12, and corresponding operation 504 of the flowchart of FIG. 10, the second portion 623 of FIG. 11 can be etched with an etchant including an acid, an oxidizer and chloride ions. In an embodiment, the etching forms a patterned metal seed region 627 on the semiconductor device 600, where the mask 622 of FIG. 11 inhibits etching the first portion 621 of the patterned metal seed region 627.

In an embodiment, the acid can include sulfuric acid, hydrogen chloride and/or phosphoric acid among others. In an embodiment, the oxidizer can include hydrogen peroxide and/or ferric chloride, among other oxidizers. In an embodiment, an acid or a salt can be used as a source for chloride ions. In an embodiment, ferric chloride, hydrogen chloride and/or sodium chloride, among others, can be used as a source of chloride ions.

In an embodiment, etching the second portion 623 of FIG. 11 can include etching the first metal region 612, barrier region 614 and second metal region 616 in a single bath (e.g., in a single process), in contrast to other methods which can etch away the first metal region 612, barrier region 614 and second metal region 616 at individual baths and/or process steps. In an embodiment, the etching can include a single etching bath, where other methods can have 2-3 etching baths (e.g., other processes can include separate etching baths for each of the first metal region 612, barrier region 614 and second metal region 616).

In an example of a single bath etchant, a metal seed region 620 having a first metal region 612 including aluminum, a barrier region 614 including molybdenum and second metal region 616 including a copper region can be etched with sulfuric acid, phosphoric acid, hydrogen peroxide and ferric chloride in a single bath to form a patterned metal seed region 627, as shown in FIG. 12.

In an embodiment, the etchants used (e.g., sulfuric acid, phosphoric acid, hydrogen peroxide and ferric chloride, among others) can be less than or equal to 10% of the total weight percent of an etching solution used, where the remaining 90% of the etching solution can be water. In an embodiment, the percent concentration of the oxidizer can be greater than, or comparable to, the combined percent concentration of the acid and source of chloride ions. In an embodiment, the percent concentration of the acid can be less than the percent concentration of the oxidizer.

In an embodiment, the first metal region 612, barrier region 614 and second metal region 616 can be etched in a single bath and/or process using an etchant including an acid, an oxidizer, and chloride ions. In an example, using ferric chloride in the etchant can substantially increase the etch rate of the barrier region 614 (e.g., molybdenum). In an embodiment, the etch rate can increase by a factor of 10. In an example, provided the same chloride ion concentration, the etch rate can increase from 50-70 micron/minute to 500-700 micron/minute by using ferric chloride.

In an embodiment, etching with an etchant including an acid, an oxidizer, and chloride ions can etch away the intermetallics 631 of FIG. 11. In an example, etching with an etchant including an acid, an oxidizer, and sodium chloride and/or ferric chloride can increase the etch rate of an aluminum-copper intermetallic from approximately 0.1 micron/minute to greater than 1 micron/minute at temperatures below of a temperature of 50 degrees Celsius. In other methods of etching, intermetallics 631 can remain after the etching process.

In an embodiment, a separation region 618 can be formed to separate portions of the patterned metal seed region 627 from contacting (e.g., positive and negative patterned metal seed regions 627). In some embodiments, the patterned metal seed regions 627 can be an interdigitated pattern. In one embodiment, the separation region 618 can include a trench region, where the trench region can be partially disposed in the silicon substrate (e.g., substrate 602).

Figure 13:
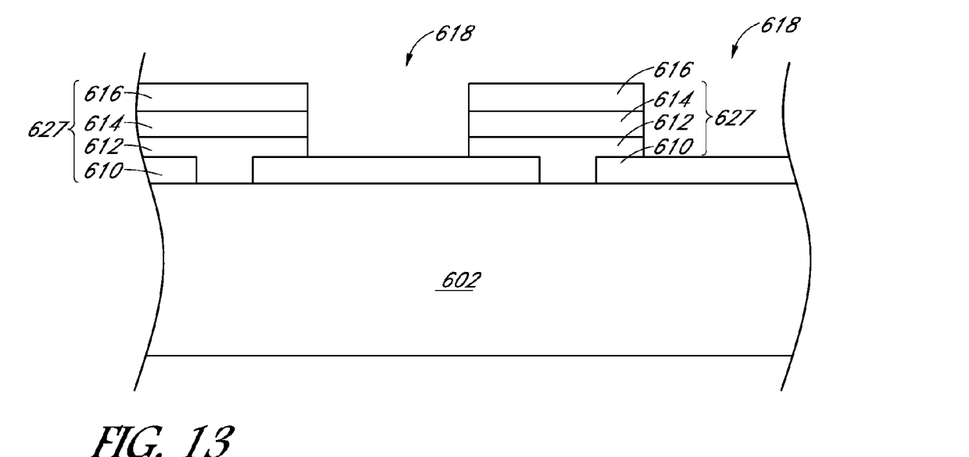
Figure 14:
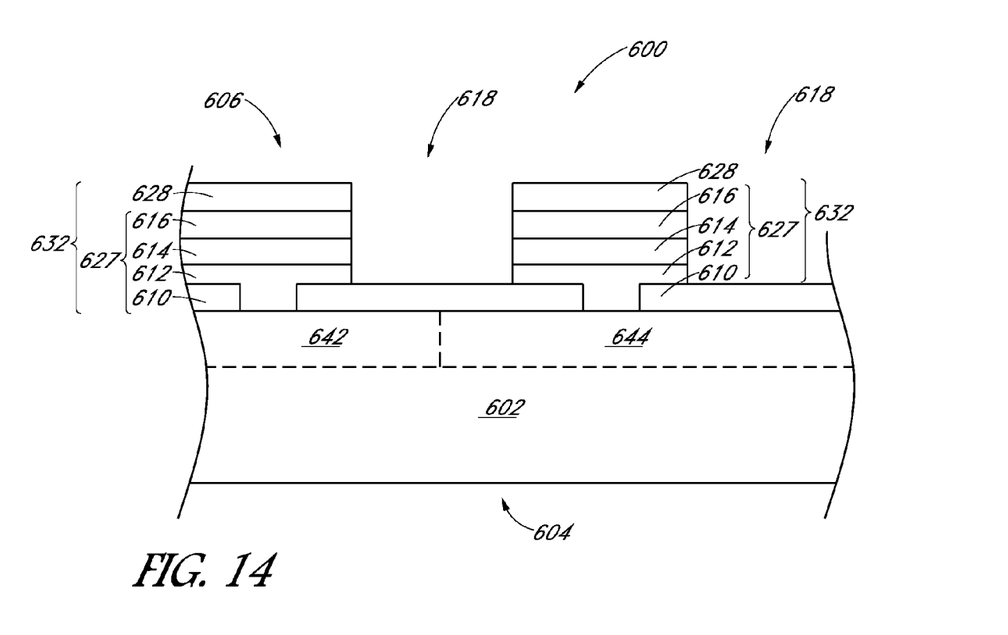
FIG. 14 illustrates another example solar cell, according to some embodiments.

FIG. 13, and corresponding operation 506 of the flowchart of FIG. 10, illustrates removing the mask 622 over the patterned metal seed region 627, according to some embodiments. In an embodiment, an ink strip process can be performed to remove the mask 622 of FIG. 12.

Referring to FIG. 14, and corresponding operation 508 of the flowchart of FIG. 10, a third metal region 628 can be formed over the patterned metal seed region 627, according to some embodiments. In an embodiment, the third metal region 628 can include copper or nickel (e.g., a copper or nickel region), and/or alloys thereof. In an embodiment, the third metal region 628, can be formed by performing a plating process. In an embodiment, the third metal region 628 can be plated directly to the patterned metal seed region 627 to form metal contact fingers 632. In an embodiment, the third metal region 628 can be formed by bonding and/or welding a metal foil (e.g., an aluminum foil) to the metal seed region 620. In an embodiment, the metal contact fingers 632 can be interdigitated metal contact fingers.

In some embodiments, a protective region can be formed on the third metal region 628. In one embodiment, the protective region can include a conductive metal (e.g., tin or silver).

FIG. 14 illustrates an example semiconductor device formed from the methods described in FIGS. 1-4 and 10-14, according to some embodiments. As shown, the semiconductor device 600 can be a solar cell. In an embodiment, the semiconductor device 600 can have a front side 604 which faces the sun during normal operation and a back side 606 opposite the front side 604. In an embodiment, the semiconductor device can include a substrate 602.

In an embodiment, the substrate 602 can be a silicon substrate. In some embodiments, the silicon substrate can be cleaned, polished, planarized and/or thinned or otherwise processed prior to the formation of the first metal region 612. In an embodiment, the silicon substrate can be single-crystalline or a multicrystalline silicon substrate.

The silicon substrate can be an N-type or a P-type silicon substrate, and can include N-type and P-type doped regions 642, 644 as shown in FIG. 14. In an embodiment, the N-type and P-type doped regions 642, 644 can be in the substrate 602. In an embodiment, the N-type and P-type doped regions can be formed over the substrate 602. In an example, the N-type and P-type doped regions 642, 644 can be doped polysilicon regions. In an embodiment, the doped polysilicon regions can be formed over the substrate. In one embodiment, a dielectric region (e.g., a tunnel oxide) can be formed between the doped polysilicon regions and the substrate. In an embodiment, the metal contact fingers 632 allow for pathways for electrical current conduction from the N-type and P-type doped regions 642, 644 to an external circuit.

In an embodiment, metal contact fingers 632 can be formed on the semiconductor device 600. In an embodiment, the metal contact fingers 632 can include a patterned metal seed region 627. In an embodiment, the patterned metal seed region 627 can include a first metal region 612, a barrier region 614 and a second metal region 616. In an embodiment, a dielectric region 610 can be between the first metal region 612 and the substrate 602, as shown. In an embodiment, the dielectric region 610 can include silicon oxide, among other oxides. In an embodiment, the first metal region 612 can include aluminum (e.g., an aluminum region), aluminum/Si, and/or alloys thereof. In an embodiment, the barrier region 614 can include nickel, a nickel vanadium alloy, molybdenum, molybdenum titanium alloy, and/or alloys thereof. In an embodiment, the second metal region 616 can include copper or nickel (e.g., a copper or nickel region), and/or alloys thereof.

In an embodiment, the metal contact fingers 632 can include a third metal region 628. In an embodiment, the third metal region 628 can include copper, nickel (e.g., a copper or nickel region), and/or alloys thereof. In an embodiment, the third metal region 628 can include a metal foil (e.g., an aluminum foil). In some embodiments, the metal contact fingers 632 can include a protective region. In one embodiment, the protective region can include tin or silver. In an embodiment, a separation region 618 can be formed to separate metal contact fingers 632 of different polarity (e.g., a positive and a negative contact finger) from contacting. In some embodiments, the separation region 618 can include a trench region, where the trench region can be a partially etched region of the silicon substrate (e.g., substrate 602).

In an embodiment, the metal contact fingers 632 can instead be formed on a front side of a solar cell (e.g., for a front-contact solar cell). In the same embodiment, the separation region 618 between metal contact fingers 632 can be formed to allow for reduced shading, e.g., to maximize light collection, on a front surface of a front-contact solar cell.

The methods described in FIGS. 1-14 are not limited to the example solar cells shown, e.g., FIGS. 9 and 14. In an embodiment, the methods of FIGS. 1-14 can be applied to front-contact solar cells, back-contact solar cells, integrated back contact (IBC) solar cells and metal wrap through (MWT) solar cells, among others.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a semiconductor device, the method comprising:
    forming a first metal region over a surface of a substrate;
    forming a barrier region over the first metal region;
    forming a second metal region over the barrier region, wherein the first metal region, barrier region and second metal region form a metal seed region;
    forming a mask over a first portion of the metal seed region;
    forming a third metal region over a second portion of the metal seed region;
    removing the mask;
    forming metal contact fingers on the semiconductor device, wherein the forming includes etching the first portion of the metal seed region with an etchant comprising an acid, an oxidizer and chloride ions, the chloride ions from a source selected from the group consisting of potassium chloride, and sodium chloride, wherein the acid and oxidizer together consist of a combination of all of sulfuric acid, phosphoric acid and hydrogen peroxide.

2. The method of claim 1, further comprising forming a protective region over the third metal region, wherein the protective region inhibits etching of the third metal region.

3. The method of claim 2, wherein forming the protective region over the third metal region comprises forming a tin or silver over the third metal region.

4. The method of claim 2, wherein etching the first portion of the metal seed region with an etchant comprising an acid, an oxidizer and chloride ions to form metal contact fingers over the semiconductor device comprises at least partially etching the protective region over the third metal region.

5. The method of claim 1, wherein forming the third metal region over the second portion of the metal seed region comprises plating the third metal region to the second portion of the metal seed region.

6. The method of claim 1, wherein forming the first metal region on the surface of the substrate comprises forming aluminum on the surface of the substrate.

7. The method of claim 1, wherein etching the first portion of the metal seed region with an etchant comprising an acid, an oxidizer and chloride ions comprises etching the first portion of the metal seed region with an etchant comprising an acid, an oxidizer and chloride ions in a single bath.

8. The method of claim 1, wherein forming the second metal region over the barrier region comprises forming copper or nickel over the barrier region.

9. The method of claim 1, wherein etching the first portion of the metal seed region with an etchant comprising an acid, an oxidizer and chloride ions to form metal contact fingers on the semiconductor device comprises etching the first portion of the metal seed region with the etchant comprising sulfuric acid, phosphoric acid, and hydrogen peroxide.

10. The method of claim 1, wherein etching the first portion of the metal seed region with an etchant comprising an acid, an oxidizer and chloride ions to form metal contact regions on the semiconductor comprises etching away intermetallics with an etchant comprising an acid, an oxidizer and chloride ions.

11. A method of fabricating a semiconductor device, the method comprising:
    forming a first metal region over a surface of a substrate;
    forming a barrier region over the first metal region;
    forming a second metal region over the barrier region, wherein the first metal region, barrier region and second metal region form a metal seed region;
    forming a mask over a first portion of the metal seed region; and
    etching a second portion of the metal seed region with an etchant comprising an acid, an oxidizer and chloride ions to form a patterned metal seed region on the semiconductor device, the chloride ions from a source selected from the group consisting of potassium chloride, and sodium chloride, wherein the acid and oxidizer together consist of a combination of all of sulfuric acid, phosphoric acid and hydrogen peroxide.

12. The method of claim 11, further comprising, after etching the second portion of the metal seed region, forming a third metal region over the patterned metal seed region to form metal contact fingers on the semiconductor device.

13. The method of claim 11, wherein forming a first metal region on the surface of the substrate comprises forming aluminum on the surface of the substrate.

14. The method of claim 11, wherein etching the second portion of the metal seed region with an etchant comprising an acid, an oxidizer and chloride ions comprises etching the second portion of the metal seed region with an etchant comprising an acid, an oxidizer and chloride ions in a single bath.

15. The method of claim 11, wherein forming a second metal region over the barrier region comprises forming copper or nickel over the barrier region.

16. The method of claim 11, wherein etching the second portion of the metal seed region with an etchant comprising an acid, an oxidizer and chloride ions comprises etching the second portion of the metal seed region with the etchant comprising sulfuric acid, phosphoric acid, and hydrogen peroxide.

17. The method of claim 11, wherein etching the second portion of the metal seed region with an etchant comprising an acid, an oxidizer and chloride ions comprises etching away intermetallics with an etchant comprising an acid, an oxidizer and chloride ions.

18. A method of fabricating a semiconductor device, the method comprising:
    forming a metal seed region over a surface of a substrate;
    forming a mask over a first portion of the metal seed region;
    forming a plated metal to a second portion of the metal seed region;
    removing the mask;
    forming metal contact fingers on the semiconductor device, wherein the forming includes etching the first portion of the metal seed region with an etchant comprising an acid, an oxidizer and chloride ions, the chloride ions from a source selected from the group consisting of potassium chloride, and sodium chloride, wherein the acid and oxidizer together consist of a combination of all of sulfuric acid, phosphoric acid and hydrogen peroxide.

19. The method of claim 18, wherein etching the first portion of the metal seed region with an etchant comprising an acid, an oxidizer and chloride ions comprises etching the first portion of the metal seed region with the etchant comprising an acid, an oxidizer and chloride ions in a single bath.

20. The method of claim 18, wherein etching the metal seed region with an etchant comprising an acid, an oxidizer and chloride ions to form metal contact fingers on the semiconductor device comprises etching the first portion of the metal seed region with the etchant comprising sulfuric acid, phosphoric acid, and hydrogen peroxide in a single bath.

* * * * *